(12) United States Patent
Lu

(10) Patent No.: US 9,519,741 B2
(45) Date of Patent: Dec. 13, 2016

(54) METHOD OF CHARACTERIZING AND MODELING LEAKAGE STATISTICS AND THRESHOLD VOLTAGE

(71) Applicant: INTERNATIONAL BUSINESS MACHINES CORPORATION, Armonk, NY (US)

(72) Inventor: Ning Lu, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 51 days.

(21) Appl. No.: 14/553,228

(22) Filed: Nov. 25, 2014

(65) Prior Publication Data

US 2016/0147923 A1    May 26, 2016

(51) Int. Cl.
G06F 17/50    (2006.01)

(52) U.S. Cl.
CPC .................. G06F 17/5036 (2013.01)

(58) Field of Classification Search
CPC ................................................ G06F 17/5036
See application file for complete search history.

(56) References Cited

U.S. PATENT DOCUMENTS

| 7,353,473 | B2 | 4/2008 | Pino et al. |
| 8,626,480 | B2 | 1/2014 | Chang et al. |
| 2011/0082680 | A1* | 4/2011 | Chang ................ G01R 31/2848 703/14 |

OTHER PUBLICATIONS

Lu et al., "Experiment and Model for Deviation from Pelgrom Scaling Relation in Device Width", IBM Semiconductor Research and Development Center, Uploaded Oct. 20, 2014, 3 pages.
U.S. Appl. No. 14/226,865, filed Mar. 27, 2014; 49 pages.

* cited by examiner

*Primary Examiner* — Vuthe Siek
(74) *Attorney, Agent, or Firm* — Steven Meyers; Andrew M. Calderon; Roberts Mlotkowski Safran Cole & Calderon, P.C.

(57) ABSTRACT

An approach includes deriving an uplift factor as a function of a width of the device for each leakage current component based on an amount of uncorrelated random variations in the leakage current component for one specific width and using the uplift factor as a multiplier for the leakage current component. The approach includes using the uplift factor for sub-threshold drain current as a multiplier of the sub-threshold drain current so that a lowering of nominal threshold voltage of the device occurs in a single simulation run. The approach further includes deriving a threshold voltage mismatch expression related to an amount of an uncorrelated random variation in sub-threshold drain current which is not directly inversely proportional to a square root of the width. The uplift factors and the threshold voltage mismatch expression within a model are used to predict statistical characteristics of the leakage current.

20 Claims, 6 Drawing Sheets

METHOD OF CHARACTERIZING AND MODELING LEAKAGE STATISTICS AND THRESHOLD VOLTAGE

FIELD OF THE INVENTION

The present invention generally relates to determining chip power optimization, and more particularly, to a method and system for determining accurate levels of leakage current and threshold voltage for a single-finger device.

BACKGROUND

Within the field of circuits and semiconductors, various electrical features of different circuit devices, such as field effect transistors (FETs), metal-oxide-semiconductor (MOS) capacitors, diodes, etc., cause quiescent current leakages and static power consumption. When the gate voltage of a FET device (i.e., the voltage difference between the gate and the source of the FET device) is larger than the threshold voltage of the FET, a large amount of electric current (also called drain current) can travel from the source to the drain. When the gate voltage applied to the FET is less than the threshold voltage, the amount of current traveling from the source to the drain (called sub-threshold drain current) is small but not zero.

Since the non-switch time in logical circuits is much longer than switch time, the accumulated sub-threshold drain current becomes non-negligible in a semiconductor chip. It is important to accurately determine total chip power in circuit design. There are instances that when the gate voltage applied to the FET is less than the threshold voltage, or even when there is no voltage applied to the gate, an amount of current still passes between the source and drain. This amount of current is known as the leakage current or "off" current and can affect the total chip power dissipation for a device. The leakage current, also known as IDDQ current, can be caused by various factors, such as diffusion, random doping fluctuation (RDF), line edge roughness (LER), etc.

SUMMARY

In an aspect of the invention, a method is implemented in a computer infrastructure having computer executable code tangibly embodied on a computer readable storage medium having programming instructions operable to: derive an uplift factor (i.e., a larger-than-one multiplier for an electric current) as a function of a width of a semiconductor single-finger device for each leakage current component based on an amount of uncorrelated random variations in the leakage current component for one specific width of the semiconductor device and use the uplift factor as a multiplier for the leakage current component; when the semiconductor device is a single-finger transistor, use the uplift factor for sub-threshold drain current as a multiplier for the sub-threshold current so that a lowering of nominal threshold voltage of the single-finger device occurs in a single simulation run; derive a threshold voltage mismatch expression which is related to an amount of an uncorrelated random variation in sub-threshold drain current and which is not directly inversely proportional to a square root of the width of the single-finger device; and use the uplift factors and the threshold voltage mismatch expression within a model to predict at least statistical characteristics of the leakage currents.

In another aspect of the invention, a computer program product is provided for determining leakage current of a single-finger device. The computer program product comprises a computer usable storage medium having program code embodied in the storage medium, the program code readable and/or executable by a computing device to: identify a nominal or average or median electrical effective width $W_{nom}$ (e.g., $W_{nom}=W_{des}+dw$) of the single finger device; insert an uplift factor $U_{plift}(W_{nom})$ as a multiplier into a statistical leakage current model for the single-finger device with design width $W_{des}$; use expression $\sigma_{uncor}(W_{nom})$ in the statistical leakage current model as a standard deviation of uncorrelated Vt variations; and adjust $U_{plift}(W_{nom})$ and $\sigma_{uncor}(W_{nom})$ such that two averages of leakage current are identical and two standard deviations of leakage current are the same when the statistical leakage current model is used in different approaches.

In another aspect of the invention, a system comprises a CPU, a computer readable memory and a computer readable storage medium, and program instructions to: derive an uplift factor (i.e., a larger-than-one multiplier for an electric current) as a function of a width of a semiconductor single-finger device for each leakage current component based on an amount of uncorrelated random variations in the leakage current component for one specific width of the semiconductor device and use the uplift factor as a multiplier for the leakage current component; when the semiconductor device is a single-finger transistor, use the uplift factor for sub-threshold drain current as a multiplier for the sub-threshold current so that a lowering of nominal threshold voltage of the single-finger device occurs in a single simulation run; derive a threshold voltage mismatch expression which is related to an amount of an uncorrelated random variation in sub-threshold drain current and which is not directly inversely proportional to a square root of the width of the single-finger device; and use the uplift factors and the threshold voltage mismatch expression within a model to predict at least statistical characteristics of the leakage currents.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
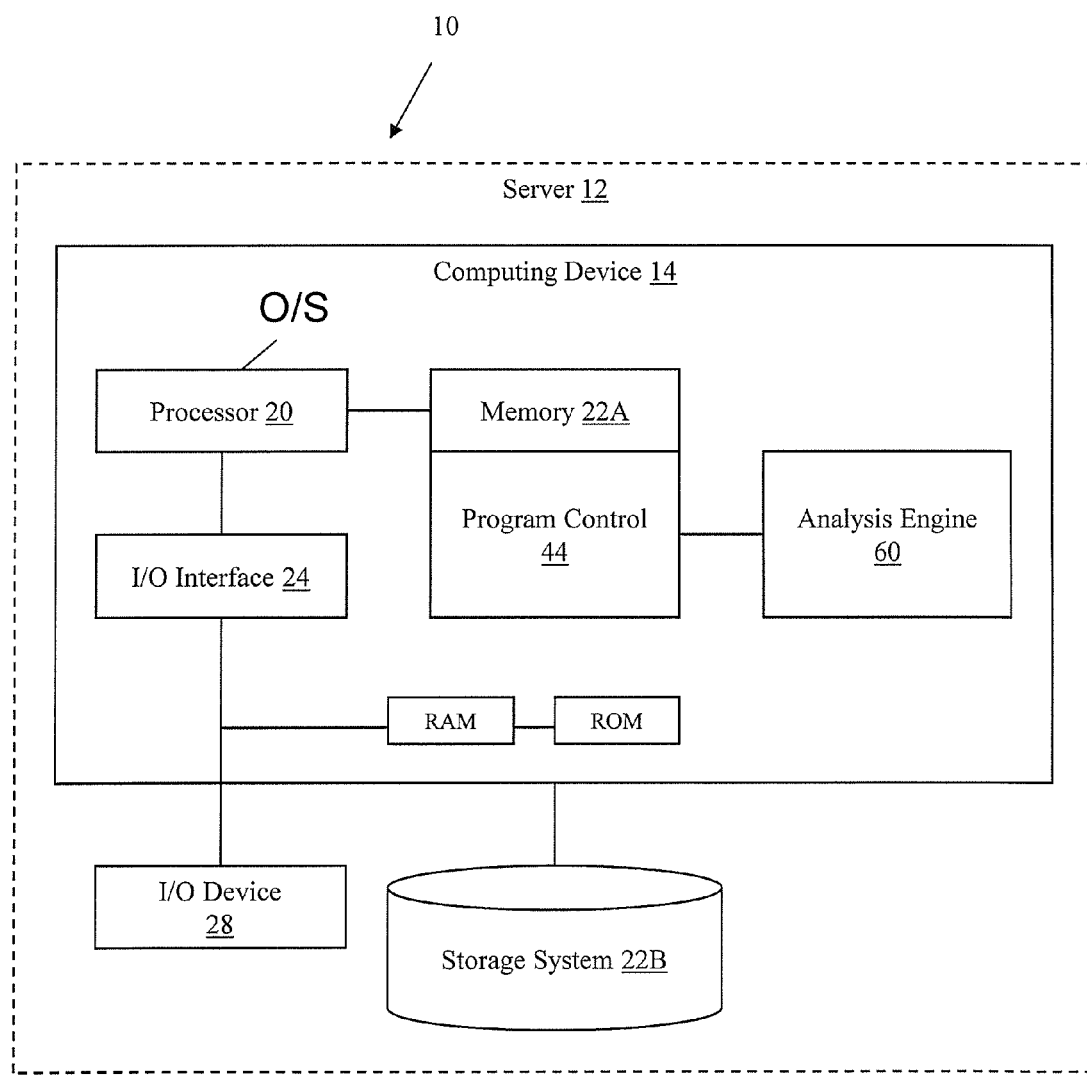
FIG. 1 is an illustrative environment for implementing the steps in accordance with aspects of the invention.

The present invention generally relates to determining chip power optimization, and more particularly, to a method and system for determining accurate levels of leakage current and threshold voltage for a single-finger device. In particular, the present invention provides a method of characterizing and modeling leakage currents and threshold voltage of a single-finger device using an uplift factor, which will not vary inversely with the square root of width, W, of the device.

For a single-finger (e.g., planar) semiconductor device (e.g., FET, MOS capacitor, MOS varactor, diode, etc.), its leakage current per unit electric width, and threshold voltage in the FET case, depends on the width W of the device after including the effect of local and/or random and/or un-correlated variations (mismatch) on the device characteristics. The present invention provides a process and system to correctly and accurately characterize and model width scaling relations of semiconductor devices, e.g., single-finger semiconductor devices, using an uplift factor in device models. In embodiments, the uplift factor as well as a fixed reference width $w_0$ and a mismatch scaling relation (see, e.g., equation 1) will not vary inversely with the square root of width W. In this way, it is possible to accurately characterize and model the median and/or mean and/or nominal device leakage and/or IDDQ as a function of device width W, and correctly predict and characterize the statistics of leakage and/or IDDQ in circuit designs. Importantly, in embodiments, the modeling of the single-finger device can be scaled along its width dimension to determine its characteristics as described in more detail below.

By way of example, the processes and systems described herein can be used to characterize and model amongst other things, e.g., (i) FET gate tunneling current;

(ii) MOS capacitor and/or MOS varactor and/or decoupling capacitor's gate leakage current; and (iii) Diode current.

Moreover, it has been found by the inventors that when a single-finger FET device is wide, RDF etc. can cause issues that affect the leakage current. For example, the variation of the leakage current in one width segment of the single-finger FET device can be uncorrelated to the variation of the leakage current in another segment of the same single-finger FET. This problem has now been addressed by the processes and systems described herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing and/or processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing and/or processing device receives computer readable program instructions from the network and forwards the computer readable program instructions for storage in a computer readable storage medium within the respective computing and/or processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions and/or acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function and/or act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions and/or acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 shows an illustrative environment 10 for managing the processes in accordance with the invention. To this extent, environment 10 includes a server 12 or other computing system that can perform the processes described herein. In particular, server 12 includes a computing device 14. The computing device 14 can be resident on a network infrastructure or computing device of a third party service provider (any of which is generally represented in FIG. 1).

The computing device 14 also includes a processor 20 (e.g., CPU), memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with external I/O device/resource 28 and storage system 22B. For example, I/O device 28 can comprise any device that enables an individual to interact with computing device 14 (e.g., user interface) or any device that enables computing device 14 to communicate with one or more other computing devices using any type of communications link. The external I/O device/resource 28 may be for example, a handheld device, PDA, handset, keyboard etc.

In general, processor 20 executes computer program code (e.g., program control 44), which can be stored in memory 22A and/or storage system 22B. Moreover, in accordance with aspects of the invention, program control 44 controls an analysis engine 60, e.g., the processes described herein. Analysis engine 60 can be implemented as one or more program code in program control 44 stored in memory 22A as separate or combined modules. Additionally, analysis engine 60 may be implemented as separate dedicated processors or a single or several processors to provide the function of these tools. While executing the computer program code, the processor 20 can read and/or write data to/from memory 22A, storage system 22B, and/or I/O interface 24. The program code executes the processes of the invention. The bus 26 provides a communications link between each of the components in computing device 14.

The computing device 14 can comprise any general purpose computing article of manufacture capable of executing computer program code installed thereon (e.g., a personal computer, server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Similarly, server 12 is only illustrative of various types of computer infrastructures for implementing the invention. For example, in embodiments, server 12 comprises two or more computing devices (e.g., a server cluster) that communicate over any type of communications link, such as a network, a shared memory, or the like, to perform the process described herein. Further, while performing the processes described herein, one or more computing devices on server 12 can communicate with one or more other computing devices external to server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2:
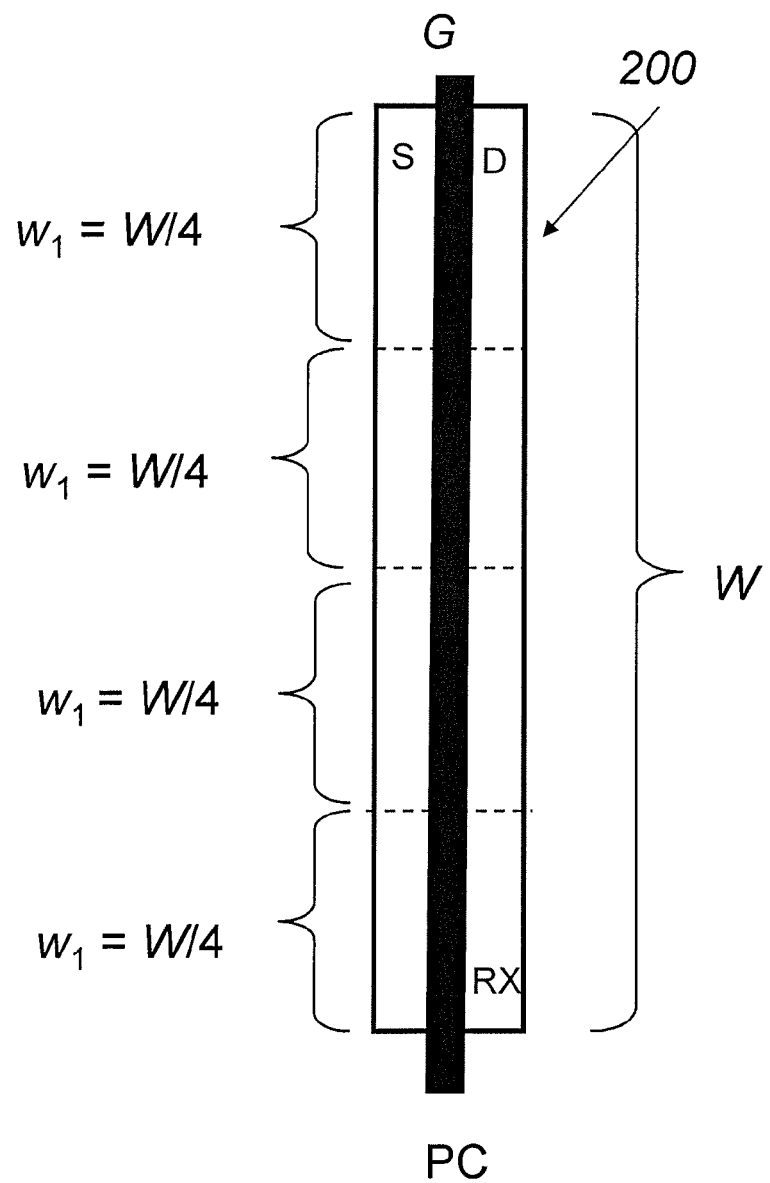
FIG. 2 show an example semiconductor device in accordance with aspects of the invention.

In embodiments, analysis engine 60 provides analysis and modeling capabilities that improve the accuracy of modeling leakage current and threshold voltage for a single-finger devices, e.g., a FET, MOS capacitor, MOS varactor, diode, etc., as representatively shown in FIG. 2 at reference numeral 200. In embodiments, analysis engine 60 can determine the leakage current of the device 200 per unit electric width, e.g., based on a plurality of segments of width, $w_1$. In this way, analysis engine 60 can characterize and model width scaling relations of semiconductor devices, e.g., single-finger semiconductor devices, using an uplift factor in device models using a statistical model. The uplift factor as well as a fixed reference width $w_0$ and a mismatch scaling relation will not vary inversely with the square root of width W.

In embodiments, analysis engine 60 can model various leakage and threshold voltage characteristics of FET or other devices with a greater level of accuracy for single-finger devices in nominal simulations, corner simulations, Monte Carlo simulations, and/or any other type of simulations. This ensures that the mean and tolerance values from Monte Carlo simulations and/or corner simulations for leakage and threshold voltage characteristics provide a greater level of accuracy than other types of characterization and modeling methods. By determining a greater level of accuracy of leakage and threshold voltage characteristics, a circuit and/or chip can be designed with minimal leakage and greater power optimization.

By way of comparison, existing leakage models are not scalable, namely, not self-consistent when applied to devices having different widths. In other words, when they are used to a same single-finger device by two different approaches, results are different. We consider a single-finger planar FET 200 (see FIG. 2) that has a design width $W_{des}$ and a corresponding nominal electrical width $W_{nom}$ ($=W_{des}+dw$). We also denote its electrical width as W which includes tolerance (see FIG. 2), and denote its channel length as L.

Approach 1: Apply existing leakage model once to the whole FET:

$$i_{leak}(\beta) = \frac{W}{L} f(V_d, V_s, V_x, T) \exp\left(\frac{V_{gs} - V_{th}(\beta)}{nv_t}\right), \quad (1)$$

with $$V_{th}(\beta) = V_{th,ave} + \sigma_{cov} G + \frac{\beta}{\sqrt{W_{nom}}} g, \quad (2)$$

where each of G and g is an independent random variable of mean zero and standard deviation one, $$\langle G \rangle = \langle g \rangle = 0, \langle G^2 \rangle = \langle g^2 \rangle = 1, \langle Gg \rangle = 0. \quad (3)$$

The average leakage current using approach 1 is obtained from Eqs. (1)-(3), $$\langle i_{leak} \rangle_{approach\,1} = \quad (4)$$

$$\left\langle \frac{W}{L} f(V_d, V_s, V_x, T) \right\rangle \exp\left(\frac{V_{gs} - V_{th,ave}}{nv_t} + \frac{\sigma_{cor}^2 + \beta^2/W_{nom}}{2(nv_t)^2}\right).$$

Figure 3:
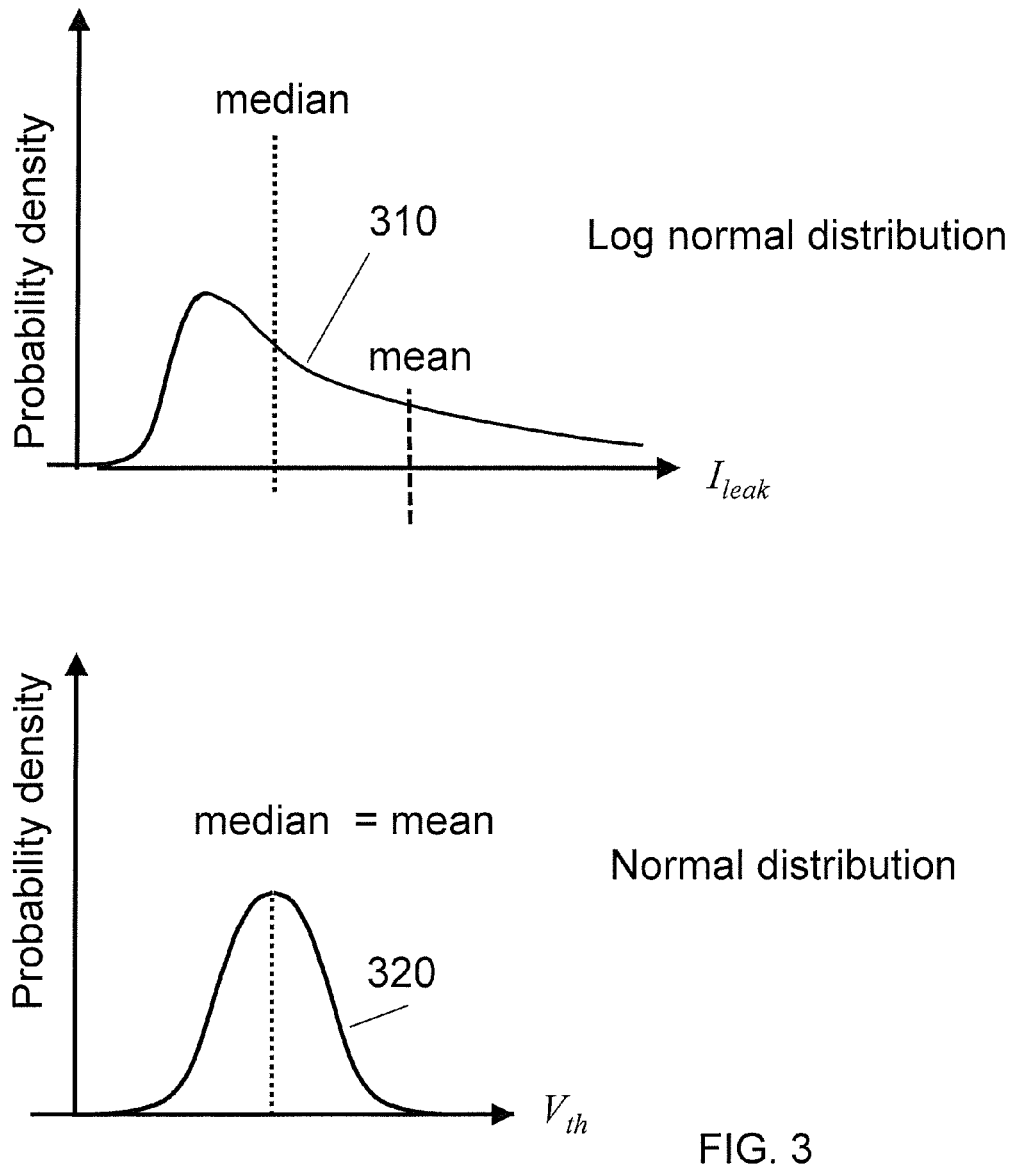
FIG. 3 shows example probability density curves for various semiconductor electrical features in accordance with aspects of the invention.

Notice that mean leakage current is larger than median leakage current, even though the mean and median of threshold voltage values are the same. This is illustrated in FIG. 3, which shows example probability density curves. Curve 310 shows a probability density curve for the leakage current for a single FET device, which is an asymmetrical distribution (e.g., a log normal distribution) and thus the median and the mean (i.e., average) are different. Curve 320 shows a probability density curve for the threshold voltage or for the logarithm of the leakage current. Curve 320 shows a symmetrical relationship, with the mean being equal to the median (e.g., a Gaussian distribution).

Alternatively, referring to FIG. 2, the planar FET 200 can be viewed as m narrower FETs connected in parallel, each with a smaller electrical width (including tolerance) of $w_1 = W/m$ and also a smaller nominal and/or mean and/or median electrical width of $w_{1,nom} = W_{nom}/m$. In this case, m=4; although other segmentation or scaling is contemplated by the present invention. In this example, the modeling will make the width scaling relation of the FET (or other device) 200 satisfy the following property: a same electrical value is obtained after the device 200 is first divided it into m narrower devices that are connected in parallel, the electric currents in each of m narrower device are then evaluated, and last the electric currents in the m narrower devices are combined together. It should be understood by those of skill in the art that if an existing characterization relation does not obey the above noted property, the scaling is changed to satisfy these properties.

Approach 2: Apply existing leakage model m times (m≥2), each time to one segment of the same single-finger FET that has an electrical width $w_1 = W/m$ (see FIG. 2):

$$i_{leak,k} = \frac{w_1}{L} f(V_d, V_s, V_x, T) \exp\left(\frac{V_{gs} - V_{th,k}}{nv_t}\right) = \quad (5)$$

$$\frac{W}{mL} f(V_d, V_s, V_x, T) \exp\left(\frac{V_{gs} - V_{th,k}}{nv_t}\right), k = 1, 2, \ldots, m, \text{ with}$$

$$V_{th,k} = V_{th,ave} + \sigma_{cor} G + \frac{\beta}{\sqrt{w_{1,nom}}} g_k = V_{th,ave} + \sigma_{cor} G + \beta \sqrt{\frac{m}{W_{nom}}} g_k, \quad (6)$$

$$k = 1, 2, \ldots, m,$$

where each of G, $g_1$, $g_1$, ..., $g_m$ is an independent random variable of mean zero and standard deviation one. Namely, they satisfy the following relations:

$$\langle G \rangle = \langle g_k \rangle = 0, \langle G^2 \rangle = \langle g_k^2 \rangle = 1, \langle Gg_k \rangle = 0, \langle g_j g_k \rangle = 0, j, \quad (7)$$
$$k=1,2,\ldots,m, j \neq k.$$

The average leakage current using approach 2 is obtained from Eqs. (5)-(7), $$\langle i_{leak} \rangle_{approach,2} = \left\langle \sum_{k=1}^{m} i_{leak,k} \right\rangle = m \langle i_{leak,i} \rangle, \text{ with} \quad (8)$$

$$\langle i_{leak} \rangle = \frac{1}{m} \left\langle \frac{W}{L} f(V_d, V_s, V_x, T) \right\rangle \exp\left(\frac{V_{gs} - V_{th,ave}}{nv_t} + \frac{\sigma_{cor}^2 + \beta^2 m/W_{nom}}{2(nv_t)^2}\right). \quad (9)$$

Consequently, it is clear from Eqs. (4), (8), and (9) that (10)

$$\langle i_{leak} \rangle_{approach\,1} < \langle i_{leak} \rangle_{approach\,2}.$$

Inequality (10) is not acceptable for modeling leakage current.

For a single-finger device 200, the modeling method introduces an uplift factor, a reference single-finger device with a design width $w_{des}$, and a threshold voltage (Vt) mismatch scaling relation that does not vary inversely with the square root of the width of the device $W_{nom}$. For example, $w_{des,ref}$ is the minimum design width of a given FET type in a given semiconductor technology. Let $w_0$ ($=w_{des,ref}+dw$) be the nominal and/or median and/or mean electric width of the reference device. The inventive modeling method expresses a leakage current as:

$$I_{leak} = U_{plift}(W_{nom}) i_{leak}(\beta = 0) \exp\left(\frac{-g\sigma_{uncor}(W_{nom})}{nv_t}\right), \quad (11)$$

with $$U_{plift}(W_{nom}) = \frac{\exp\left[\frac{1}{2}(\sigma_0/nv_t)^2\right]}{\sqrt{1 + \{\exp[(\sigma_0/nv_t)^2] - 1\} w_0/W_{nom}}}, \quad (12)$$

$$\sigma_{uncor}(W_{nom}) = nv_t \sqrt{\ln\left(1 + \frac{w_0}{W_{nom}} \{\exp[(\sigma_0/nv_t)^2] - 1\}\right)}. \quad (13)$$

Notice that the uplift factor has a unit value at $w_0$, $U_{plift}(w_0)=1$, and uncorrelated random variation has a desired property of $\sigma_{uncor}(w_0)=\sigma_0$. In Eq. (11), $i_{leak}$ is a leakage resistance model that does not include any uplift factor. Any example is given in Eq. (1). That $\beta=0$ in $i_{leak}(\beta=0)$ means setting uncorrelated threshold voltage variations to zero.

In embodiments, the ratio $W_{nom}/w_0$ does not have to be an integer. Also:
(i) $W_{nom}$ is a nominal electrical width of the device;
(ii) $v_t$ is thermal voltage, $nv_t$ is related to sub-threshold slope through $S=(\ln 10)nv_t$; and
(iii) $\sigma_0$ is an uncorrelated Vt random variation of a reference device that has a nominal electric width $w_0$.

Using Eqs. (11)-(13), it is straightforward to obtain the average leakage current in the above mentioned approach 1 as:

$$\langle I_{leak} \rangle_{approach\ 1} = \langle i_{leak}(\beta=0) \rangle \exp[(\frac{1}{2}(\sigma_0/nv_t)^2].$$

Next is a reconsideration of approach (2). In approach 2, as mentioned above, the device 200 is first divided it into m narrower devices that are connected in parallel. Each narrower device has an electrical width of $w_1=W/m$ and a nominal and/or mean and/or median electrical width of $w_{1,nom}=W_{nom}/m$. Then, the leakage current model (11) is applied to each of m narrow devices. It leads to the following average leakage current for each of m narrow devices:

$$\langle I_{leak,k} \rangle = \frac{1}{m} \langle i_{leak}(\beta=0) \rangle \exp\left[\frac{1}{2}(\sigma_0/nv_t)^2\right], k = 1, 2, \ldots, m.$$

Last, the electric currents in the m narrower devices are added together to give total leakage current. The average of total leakage current is found to be $$\langle I_{leak} \rangle_{approach\ 2} = \left\langle \sum_{k=1}^{m} I_{leak,k} \right\rangle = \sum_{k=1}^{m} \langle I_{leak,k} \rangle = \langle i_{leak}(\beta=0) \rangle \exp\left[\frac{1}{2}(\sigma_0/nv_t)^2\right].$$

Thus, by using the model, mean leakage current values from approach 1 agrees with that from approach 2, $$\langle I_{leak} \rangle_{approach\ 1} = \langle I_{leak} \rangle_{approach\ 2}. \quad (14)$$

Also, it can be verified that the variance values from two different approaches are also equal.

Notice that in Eq. (13), the uncorrelated Vt random variation expression is not inversely proportional to the square root of device width $W_{nom}$. This is different from the conventional Pelgrom scaling relationship of $1/\sqrt{W_{nom}}$ for mismatch.

Advantageously, the usage of width-dependent uplift factor $U_{plift}$ as a current multiplier in inventive $I_{leak}$ expression (11) is linked to a shift and/or change in the single-point threshold voltage for a FET device. This can be seen by rewriting Eq. (11) as:

$$I_{leak} = i_{leak}(\beta=0)\exp\left(\frac{-V_{th,shift}(W_{nom}) - \sigma_{uncor}(W_{nom})g}{nv_t}\right), \quad (15)$$

with $$U_{plift}(W_{nom}) = \exp\left(-\frac{V_{th,shift}(W_{nom})}{nv_t}\right). \quad (16)$$

Substituting Eqs. (1) and (2) into Eq. (15), the statistical expression of threshold voltage expression contained in Eq. (15) is $$V_{th} = V_{th,ave} + \sigma_{cor}G + V_{th,shift}(W_{nom}) + \sigma_{uncor}(W_{nom})g. \quad (17)$$

An explicit expression of $V_{th,shift}$ follows from Eqs. (16) and (13), $$V_{th,shift}(W_{nom}) = -\frac{nv_t}{2}\ln\left(\frac{W_{nom}/w_0}{1+(W_{nom}/w_0-1)\exp[-(\sigma_0/nv_t)^2]}\right), \quad (18)$$

which is width dependent and has a property that $V_{th,shift}(w_0)=0$. It follows from Eq. (17) that the average threshold voltage varies with device width, $$\langle V_{th}(W_{nom}) \rangle = V_{th,ave} + V_{th,shift}(W_{nom}) = \langle V_{th}(w_0) \rangle + V_{th,shift}(W_{nom}). \quad (19)$$

It also follows from Eq. (17) that nominal and/or median threshold voltage (using a single-point definition) is also width dependent, $$V_{th,nominal} = V_{th,median} = V_{th}|_{G=0,g=0} = V_{th,ave} + V_{th,shift}(W_{nom}). \quad (20)$$

Figure 4:
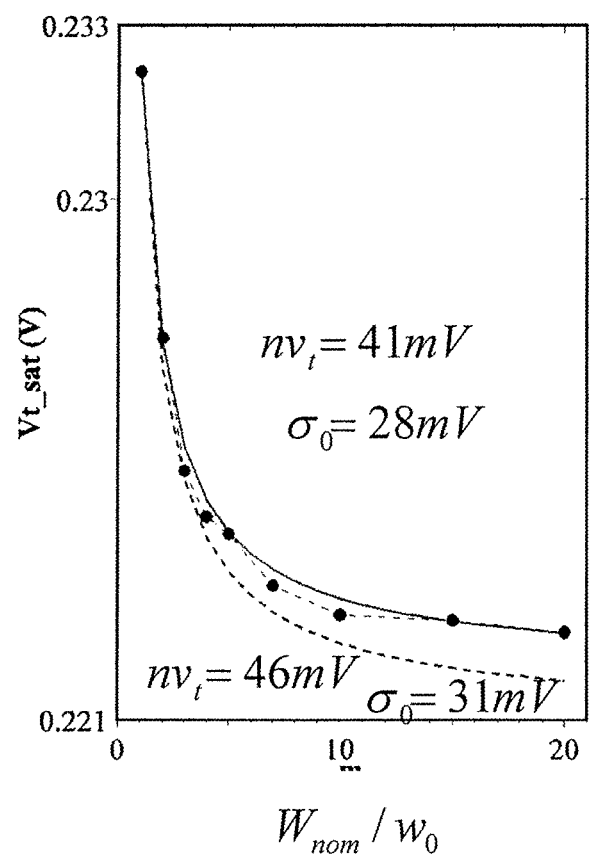
FIG. 4 shows an exemplary relationship of threshold voltage to a width of a semiconductor device $W_{nom}/w_0$ in accordance with aspects of the invention.

These new relations can be used when defining and/or specifying the device and/or when fitting and/or building the models of the single-finger device, e.g., FET. FIG. 4 shows an example of the lowering of threshold voltage versus the width $W_{nom}$ of the device.

Flow Diagram

Figure 5:
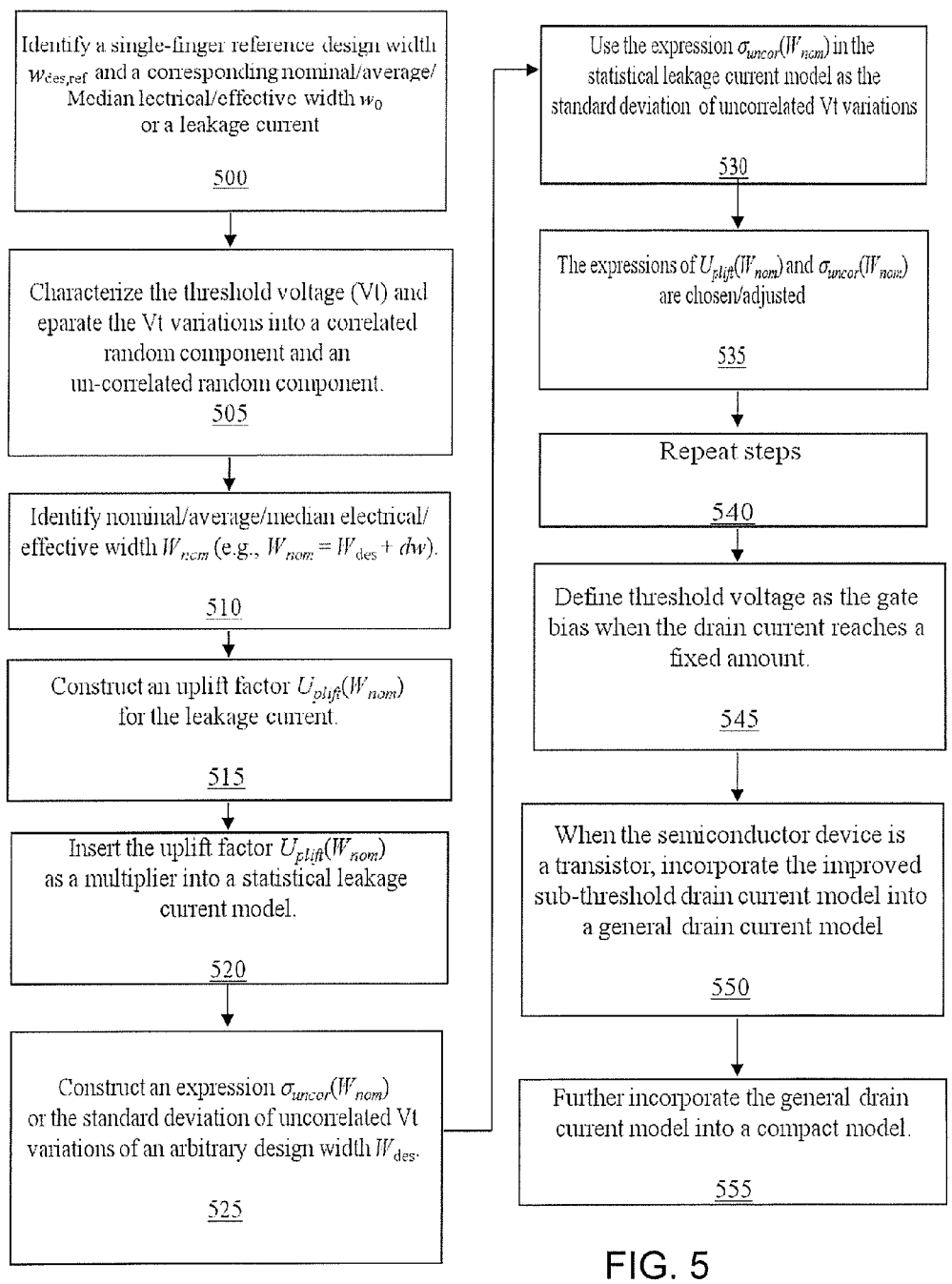
FIG. 5 shows an example flow in accordance with aspects of the invention.

FIG. 5 shows an exemplary flow for performing aspects of the present invention. The steps of FIG. 5 may be implemented in the environment of FIG. 1, for example. The flowchart and block diagrams in FIG. 5 illustrates the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As should be understood from the flow of FIG. 5, for a given type of semiconductor device (e.g., low Vt NFET, high Vt PFET, analog Vt NFET, thick oxide PFET, MOS capacitor, MOS varactor, or diode, etc.), it is now possible to develop a single-finger leakage current model that is valid for an arbitrary single-finger design width $W_{des}$ and is also self-consistent when two leakage current expressions from the following modeling approaches are compared:
(i) Apply the leakage model once to the whole single-finger device; and
(ii) Treat the whole single-finger device as multiple (m) narrower devices of the same type connected in parallel and apply the leakage model to each of m individual narrower devices (i.e., apply the leakage model m times).

Leakage current examples include sub-threshold drain current in a FET, gate tunneling current in a FET, leakage current in a MOS capacitor and/or varactor device, diode current, etc.

At step 500, for the given type of semiconductor device, the processes identify a single-finger reference design width $w_{des,ref}$ (e.g., $w_{des,ref}$ is the minimum design width of a given device type in a given semiconductor technology) and also identify a corresponding nominal and/or average and/or median electrical/effective width $w_0$ ($=w_{des,ref}+dw$) for a leakage current. At step 505, the processes characterize the threshold voltage (Vt) variations in a single-finger device of the given type that has the design width $w_{des,ref}$, and separate the Vt variations into a correlated random component and an uncorrelated random component (e.g., random dopant fluctuation of the single-finger device). In embodiments, the standard deviation of the correlated Vt random variation is denoted as $\sigma_{cor}$ and the standard deviation of the uncorrelated Vt random variation is denoted as $\sigma_0$, as should be understood by the above equations.

At step 510, for a semiconductor device of an arbitrary single-finger design width $W_{des}$, the processes (e.g., analysis engine) identify its nominal and/or average and/or median electrical and/or effective width $W_{nom}$ (e.g., $W_{nom}=W_{des}+dw$). At step 515, the processes construct an uplift factor $U_{plift}(W_{nom})$ for the leakage current. The uplift factor is a function of two ratios $W_{nom}/w_0$ and $\sigma_0/nv_t$, where $v_t=k_BT/q$ is the thermal voltage ($k_B$ is Boltzmann's constant, T is absolute temperature, q is electronic charge) and $nv_t$ is related to sub-threshold slope S through $S=(\ln 10)nv_t=2.3nv_t$. In a long channel case, n is sub-threshold swing and/or body-effect. In embodiments, the uplift factor $U_{plift}(W_{nom})$ has the following properties:

(i) There is no uplift at the reference design width $w_{des, ref}$, $U_{plift}(w_0)=1$;

(ii) There is no uplift when there is no uncorrelated random variations, $U_{plift}(W_{nom})=1$ when $\sigma_0=0$;

(iii) For a given ratio $\sigma_0/nv_t$, the uplift factor increases monotonically with the increase of the ratio $W_{nom}/w_0$ (see, e.g., FIG. 6A); and (iv) For a given ratio $W_{nom}/w_0$, the uplift factor increases monotonically with the increase of the ratio $\sigma_0/nv_t$.

At step 520, the processes insert the uplift factor $U_{plift}(W_{nom})$ as a multiplier into a statistical leakage current model (for a single-finger device) with the design width $W_{des}$ (see, e.g., equation 1). At step 525, the processes construct an expression $\sigma_{uncor}(W_{nom})$ for the standard deviation of uncorrelated Vt variations of an arbitrary design width $W_{des}$ (see, e.g., equation 4). In embodiments, the amount of uncorrelated Vt variation, $\sigma_{uncor}(W_{nom})$, is a function of $\sigma_0$, thermal voltage $nv_t$, and the ratio $W_{nom}/w_0$. In embodiments, the expression $\sigma_{uncor}(W_{nom})$ has the following properties:

(i) It reduces to the given amount of uncorrelated Vt variation at the reference design width $w_{des,ref}$, $\sigma_{uncor}(w_0) = \sigma_0$;

(ii) There is no uncorrelated Vt variation at all when $\sigma_0$ is zero, $\sigma_{uncor}(W_{nom})=0$ when $\sigma_0=0$;

(iii) It is not inversely proportional to the square root of $W_{nom}$. This is shown in equation (4);

(iv) The ratio $\sigma_{uncor}(W_{nom})/nv_t$ is a function of two ratios $W_{nom}/w_0$ and $\sigma_0/nv_t$;

(v) For a given ratio $\sigma_0/nv_t$, the ratio $\sigma_{uncor}(W_{nom})/nv_t$ decreases monotonically with the increase of the ratio $W_{nom}/w_0$; and (vi) For a given ratio $W_{nom}/w_0$, the ratio $\sigma_{uncor}(W_{nom})/nv_t$ increases monotonically with the increase of the ratio $\sigma_0/nv_t$.

At step 530, the processes use the expression $\sigma_{uncor}(W_{nom})$ in the statistical leakage current model as the standard deviation of uncorrelated Vt variations. At step 535, the expressions of $U_{plift}(W_{nom})$ and $\sigma_{uncor}(W_{nom})$ are chosen and/or adjusted such that two averages of leakage current are identical and two standard deviations of leakage current are also the same when the statistical leakage model is used in the following two different approaches:

(i) Apply the model once to the whole single-finger device; and (ii) Treat the whole single-finger device as multiple (m) narrower devices of the same type connected in parallel (e.g., let $W_{nom}=mw_0$ with m being an arbitrary positive integer) and apply the model to each of m individual narrower devices (i.e., apply the model m times).

At step 540, when the semiconductor device is a transistor, repeat the above steps above for sub-threshold drain current. In this way, the processes will verify that the nominal and/or median and/or average threshold voltage of the transistor has the following property: its absolute value decreases monotonically with the increase of transistor's design width $W_{des}$. At step 545, the processes define the threshold voltage in step 545, as the gate bias when the drain current reaches a fixed amount, e.g., (300 nA)*$W_{nom}/L_{nom}$ for NFET and (70 nA)*$W_{nom}/L_{nom}$ for PFET (i.e., constant current definition or single point definition). At step 550 when the semiconductor device is a transistor the processes incorporate (i) the above improved sub-threshold drain current model into a general drain current model of the transistor, and (ii) the general drain current model of the transistor into a compact model of the transistor (which also includes other electrical characteristics of the transistor, such as other gate tunneling currents and capacitance elements among gate, source, drain, and substrate nodes).

Thus, the analysis engine is able to provide a result that estimates the threshold voltage for devices associated with a single-finger planar device that has an arbitrary width. As such, the analysis engine provides for a FET analysis model that is consistent regardless of whether the width scaling of the device, e.g., FET.

Figure 6A:
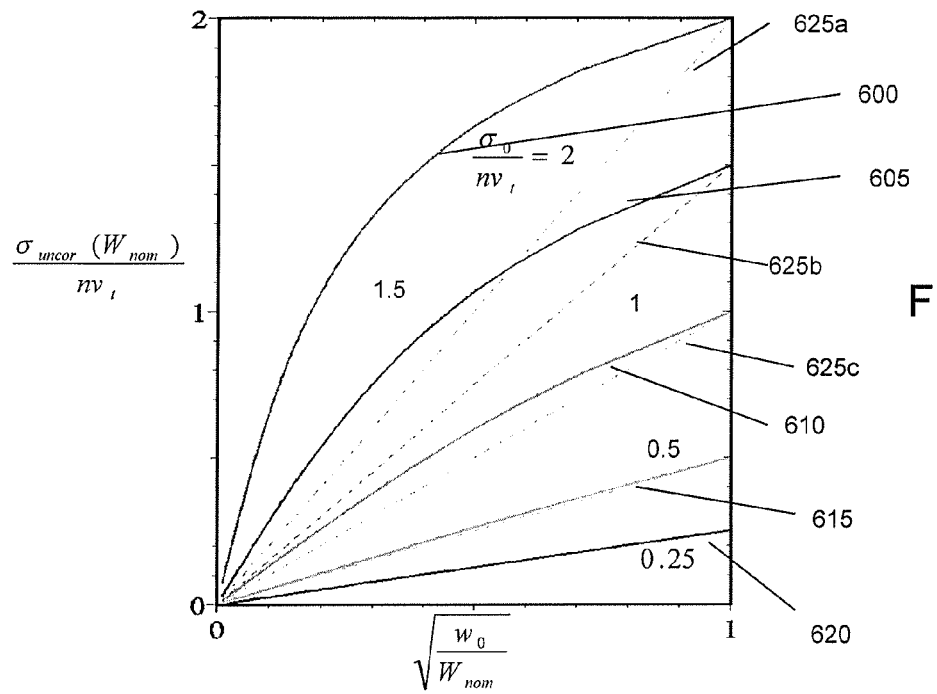
FIGS. 6A and 6B show example graphical representations of various semiconductor electrical features in accordance with aspects of the invention.
Figure 6B:
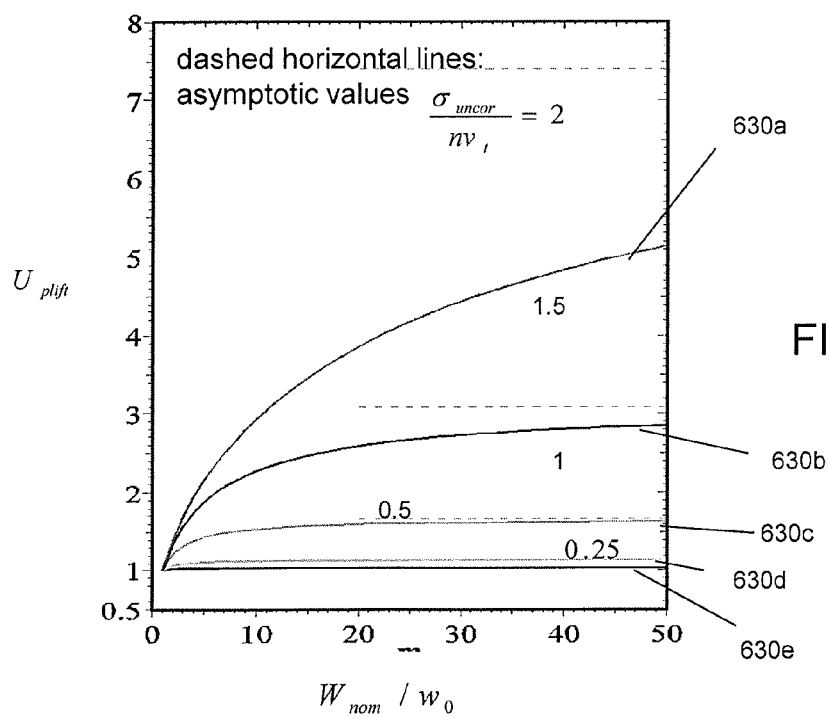

FIGS. 6A and 6B show example graphical representations of various semiconductor electrical features in accordance with aspects of invention. FIG. 6A shows curves 600, 605, 610, 615 and 620 of a single-finger device, plotted according to aspects of the present invention. Specifically, curves 600, 605, 610, 615 and 620 are plotted against $\sigma_{uncor}(W_{nom})/nv_t$ versus $\sqrt{w_0/W_{nom}}$. In embodiments, curves 600, 605, 610, 615 and 620 can be derived by using the expressions derived by the analysis engine as described above for 5 different values of $\sigma_0/nv_t$. In embodiments, curve 600 uses $\sigma_0/nv_t=2$, curve 605 is for $\sigma_0/nv_t=1.5$, curve 610 is for $\sigma_0/nv_t=1$, curve 615 is for $\sigma_0/nv_t=0.5$ and curve 620 is $\sigma_0/nv_t=0.25$. As a comparison, curves 625a-c plot $\sigma_{uncor}(W_{nom})/nv_t$ versus $\sqrt{w_0/W_{nom}}$ not using the expressions derived by the analysis engine. As this seen, the present invention provides a more accurate description of the uncorrelated standard deviation over width segments of a single-finger device.

FIG. 6B shows different curves with uplift factors. In embodiments, values of the uplift factor are determined for different values of m. In FIG. 6B, the curves are plotted against, $U_{uplift}$ versus $W_{nom}/w_0$. In embodiments, curve 630a is for $\sigma_0/nv_t=2$, curve 630b is for $\sigma_0/nv_t=1.5$, curve 630c is for $\sigma_0/nv_t=1$, curve 630d is for $\sigma_0/nv_t=0.5$ and curve 630e is $\sigma_0/nv_t=0.25$. The dashed lines are asymptotic values.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (e.g., a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method implemented in a computer infrastructure having computer executable code tangibly embodied on a computer readable storage medium having programming instructions operable to:
    derive an uplift factor as a function of a width of a single-finger semiconductor device for each leakage current component based on an amount of uncorrelated random variations in the leakage current component for one specific width of the semiconductor device and use the uplift factor as a multiplier for the leakage current component;
    when the semiconductor device is a single-finger transistor, use the uplift factor for sub-threshold drain current as a multiplier of the sub-threshold drain current so that a lowering of nominal threshold voltage of the single-finger device occurs in a single simulation run;
    derive a threshold voltage mismatch expression which is related to an amount of an uncorrelated random variation in sub-threshold drain current and which is not directly inversely proportional to a square root of the width of the single-finger device;
    use the uplift factors and the threshold voltage mismatch expression within a semiconductor device model to predict at least statistical characteristics of the leakage currents and
    use the deriving steps and the using steps in manufacturing an integrated circuit chip.

2. The method of claim 1, wherein the leakage current component comprises sub-threshold drain current, gate tunneling currents, and diode currents.

3. The method of claim 1, wherein the amount of uncorrelated random variations comprises a random dopant fluctuation.

4. The method of claim 1, wherein an amount of the lowering of the nominal threshold voltage is a function of a total width of the single-finger device.

5. The method of claim 1, wherein using the uplift factors and the threshold voltage mismatch expression predict average threshold voltage and threshold voltage mismatch of the single-finger device based on a plurality of width segments of the single-finger device.

6. The method of claim 1, wherein the semiconductor device model is a compact model of the single-finger device.

7. The method of claim 1, wherein the leakage current component comprises a plurality of width segments of the single-finger device.

8. The method of claim 1, wherein the uplift factor is a function of two ratios, $W_{nom}/w_0$ and $\sigma_0/nv_t$, where:
    $W_{nom}$ is a nominal electrical width of the single-finger device,
    $w_0$ is a nominal electrical width of a reference single-finger device,
    $\sigma_0$ is an uncorrelated variation of threshold voltage in a reference device,
    $v_t = k_B T/q$ is thermal voltage,
    $k_B$ is Boltzmann's constant,
    T is absolute temperature,
    q is electronic charge, and
    $nv_t$ is related to sub-threshold slope S through $S = (\ln 10)nv_t$.

9. The method of claim 8, wherein the usage of uplift factor and the threshold voltage mismatch expression in the semiconductor device model takes the following form:

$$I_{leak} = U_{plift}(W_{nom})i_{leak}(L, W, V_g, V_d, V_s, V_x, T)\exp\left(\frac{-g\sigma_{uncor}(W_{nom})}{nv_t}\right),$$

wherein:
    $W_{nom}(=W_{des}+dw)$ is a nominal electrical width of the single-finger device that has a design width $W_{des}$,
    W is an electrical width of the single-finger device, including width tolerance,
    $I_{leak}$ is a leakage current of the single-finger device after including the uplift factor and threshold voltage mismatch expression,
    $i_{leak}$ is a leakage current of the single-finger device before including the uplift factor and with setting threshold voltage mismatch to zero,
    L is a channel length of the single-finger device;
    $V_g$ is a gate voltage;
    $V_d$ is a drain voltage;
    $V_s$ is a source voltage;
    $V_x$ is a substrate voltage;
    $V_{gs} = V_g - V_s$ is a gate bias;
    T is absolute temperature; and
    $V_{th}$ is a threshold voltage.

10. The method of claim 9, further comprising treating the single-finger device as multiple (m) narrower devices of a same type and same channel length connected in parallel and applying the threshold voltage mismatch expression in the model to each of m individual narrower devices.

11. The method of claim 10, wherein the electrical features are at least one of leakage current and threshold voltage, and the method further comprises determining an uncorrelated component and a correlated component for the single-finger device.

12. The method of claim 10, wherein the single-finger device is one of low Vt NFET, high Vt PFET, analog Vt NFET, thick oxide PFET, MOS capacitor, MOS varactor, and diode.

13. A computer program product for determining leakage current, the computer program product comprising a computer usable storage medium having program code embodied in the storage medium, the program code readable/executable by a computing device to:
    identify a nominal or average or median electrical effective width $W_{nom}$ (e.g., $W_{nom} = W_{des} + dw$) of a single finger device that has a design width $W_{des}$;

insert an uplift factor $U_{plift}(W_{nom})$ as a multiplier into a statistical leakage current model for the single-finger device;

use expression $\sigma_{uncor}(W_{nom})$ in the statistical leakage current model as a standard deviation of uncorrelated threshold voltage variations;

adjust $U_{plift}(W_{nom})$ and $\sigma_{uncor}(W_{nom})$ such that two averages of leakage current are identical and two standard deviations of leakage current are the same when the statistical leakage current model is used in different approaches; and use the identifying, inserting, using and adjusting steps in manufacturing an integrated circuit chip.

14. The computer program product of claim 13, wherein one average of leakage current and one standard deviation of leakage current are the result of applying leakage current model $$I_{leak} = U_{plift}(W_{nom}) i_{leak}(L, W, V_g, V_d, V_s, V_x, T) \exp\left(\frac{-g\sigma_{uncor}(W_{nom})}{nv_t}\right),$$

once to a whole width of the single-finger device, and the other average of leakage current and standard deviation of leakage current are the result of applying the leakage current model multiple times, each time to one segment of the single-finger device.

15. The computer program product of claim 13, further comprising constructing the uplift factor $U_{plift}(W_{nom})$ for leakage current of the single-finger device, wherein the uplift factor is a function of two ratios $W_{nom}/w_0$ and of $\sigma_0/nv_t$, where $W_{nom}(=W_{des}+dw)$ is a nominal electrical width of the single-finger device that has a design width $W_{des}$, $w_0(=w_{des,ref}+dw)$ is a nominal electrical width of a reference single-finger device that has a design width $w_{des,ref}$, $\sigma_0$ is an uncorrelated variation of threshold voltage in the reference device, $v_t=k_B T/q$ is thermal voltage, $k_B$ is Boltzmann's constant, T is absolute temperature, q is electronic charge, and $nv_t$ is related to sub-threshold slope S through $S=(\ln 10)nv_t$.

16. The computer program product of claim 15, wherein the uplift factor $U_{plift}(W_{nom})$ has the following properties:
(i) there is no uplift at reference design width $W_{des,ref}$, $U_{plift}(W_{nom})=1$;
(ii) there is no uplift when there is no uncorrelated random variations, $U_{plift}(W_{nom})=1$ when $\sigma_0=0$;
(iii) for a given ratio $\sigma_0/nv_t$, the uplift factor increases monotonically with an increase of the ratio $W_{nom}/w_0$; and
(iv) for a given ratio $W_{nom}/w_0$, the uplift factor increases monotonically with an increase of the ratio $\sigma_0/nv_t$.

17. The computer program product of claim 16, wherein an amount of the uncorrelated threshold voltage variation, $\sigma_{uncor}(W_{nom})$, is a function of $\sigma_0$, thermal voltage $nv_t$, and the ratio $W_{nom}/w_0$.

18. The computer program product of claim 17, wherein the expression $\sigma_{uncor}(W_{nom})$, has the following properties:
(i) it reduces to a given amount of uncorrelated threshold voltage variation at a reference design width $w_{des,ref}$, $\sigma_{uncor}(w_0)=\sigma_0$;
(ii) there is no uncorrelated threshold voltage variation when $\sigma_0$ is zero, $\sigma_{uncor}(W_{nom})=0$ when $\sigma_0=0$;
(iii) it is not inversely proportional to the square root of $W_{nom}$;
(iv) the ratio $\sigma_{uncor}(W_{nom})/nv_t$ is a function of two ratios $W_{nom}/w_0$ and $\sigma_0/nv_t$;
(v) for a given ratio $\sigma_0/nv_t$, the ratio $\sigma_{uncor}(W_{nom})/nv_t$ decreases monotonically with the increase of the ratio $W_{nom}/w_0$; and
(vi) for a given ratio $W_{nom}/w_0$, the ratio $\sigma_{uncor}(W_{nom})/nv_t$ increases monotonically with the increase of the ratio $\sigma_0/nv_t$.

19. The computer program product of claim 13, wherein the different approaches comprises applying the model once to a whole single-finger device and treating the whole single-finger device as multiple (m) narrower devices of a same type connected in parallel and apply the model to each of m individual narrower devices.

20. A system comprising:
a CPU and a computer readable memory;
first program instructions to derive an uplift factor as a function of a width of a single-finger semiconductor device for each leakage current component based on an amount of uncorrelated random variations in the leakage current component for one specific width of the semiconductor device and use the uplift factor as a multiplier for the leakage current component;
second program instructions to use the uplift factor for sub-threshold drain current as a multiplier of the sub-threshold drain current so that a lowering of nominal threshold voltage of the single-finger device occurs in a single simulation run when the semiconductor device is a single-finger transistor;
third program instructions to derive a threshold voltage mismatch expression which is related to an amount of an uncorrelated random variation in sub-threshold drain current and which is not directly inversely proportional to a square root of the width of the single-finger device; and
fourth program instructions to use the uplift factors and the threshold voltage mismatch expression within a model to predict at least statistical characteristics of the leakage currents,
wherein the first through fourth program instructions are used in manufacturing an integrated circuit chip, and
wherein the program instructions are executed by the CPU via the computer readable memory.

* * * * *